United States Patent
Greenspan et al.

(10) Patent No.: US 11,772,399 B2
(45) Date of Patent: Oct. 3, 2023

(54) CREATING MORPHING OBJECTS BY INKJET PRINTING THERMORESPONSIVE HYDROGELS

(71) Applicant: Accenture Global Solutions Limited, Dublin (IE)

(72) Inventors: Mark Benjamin Greenspan, San Francisco, CA (US); Lavinia Andreea Danielescu, San Francisco, CA (US); Jack Forman, Wyckoff, NJ (US); Aditi Maheshwari, San Francisco, CA (US)

(73) Assignee: Accenture Global Solutions Limited, Dublin (IE)

( * ) Notice: Subject to any disclaimer, the term of this patent is extended or adjusted under 35 U.S.C. 154(b) by 0 days.

(21) Appl. No.: 17/510,624

(22) Filed: Oct. 26, 2021

(65) Prior Publication Data

US 2022/0126615 A1 Apr. 28, 2022

Related U.S. Application Data

(60) Provisional application No. 63/105,410, filed on Oct. 26, 2020.

(51) Int. Cl.
*B41M 3/00* (2006.01)
*H05K 3/12* (2006.01)

(52) U.S. Cl.
CPC ............ *B41M 3/006* (2013.01); *H05K 3/125* (2013.01)

(58) Field of Classification Search
CPC ......... B33Y 80/00; B33Y 10/00; B33Y 30/00; H05K 3/125; B29C 64/112; B32B 2457/208; C23C 14/00; B41M 3/006

USPC .................................................. 427/2.1, 2.24
See application file for complete search history.

(56) References Cited

U.S. PATENT DOCUMENTS

| | | | |
|---|---|---|---|
| 2004/0145629 A1* | 7/2004 | Silverbrook | H05K 1/185 347/40 |
| 2004/0164649 A1 | 8/2004 | Xu et al. | |
| 2007/0059459 A1 | 3/2007 | Yang | |

(Continued)

FOREIGN PATENT DOCUMENTS

| | | |
|---|---|---|
| CN | 110241637 | 9/2019 |
| KR | 20170097937 | 8/2017 |

(Continued)

OTHER PUBLICATIONS

An et al., "Predicting origami-inspired programmable self-folding of hydrogel trilayers," Smart Materials and Structures, Oct. 18, 2016, 25(11):11LT02, 8 pages.

(Continued)

*Primary Examiner* — Tabassom Tadayyon Eslami
(74) *Attorney, Agent, or Firm* — Fish & Richardson P.C.

(57) ABSTRACT

This document describes morphing objects that are created using hydrogels and techniques for creating and controlling the morphing objects. In one aspect, a method for creating a morphing object includes creating one or more heating elements on a substrate by applying one or more conductive traces onto at least one of a first surface of the substrate or a second surface of the substrate opposite the first surface and forming a hydrogel pattern on the first surface of the substrate by applying a hydrogel ink to the first surface of the substrate based on a predefined pattern.

14 Claims, 10 Drawing Sheets

(56) References Cited

U.S. PATENT DOCUMENTS

| | | | | |
|---|---|---|---|---|
| 2007/0184238 | A1* | 8/2007 | Hockaday | B32B 27/36 |
| | | | | 428/98 |
| 2011/0237700 | A1* | 9/2011 | Miyabayashi | C08F 291/04 |
| | | | | 522/64 |
| 2012/0111599 | A1 | 5/2012 | Roberson et al. | |
| 2016/0121546 | A1* | 5/2016 | Yao | B29C 64/106 |
| | | | | 428/221 |
| 2017/0217091 | A1 | 8/2017 | Hull | |
| 2018/0251649 | A1 | 9/2018 | Lewis et al. | |

FOREIGN PATENT DOCUMENTS

| | | |
|---|---|---|
| WO | WO 2003/050824 | 6/2003 |
| WO | WO 2007/139938 | 12/2007 |
| WO | WO 2017/198448 | 11/2017 |

OTHER PUBLICATIONS

EP Extended Search Report in European Appln. No. 21204871.4, dated Mar. 21, 2022, 12 pages.

Barui, "3D inkjet printing of biomaterials: Principles and applications," Med. Devices Sensors, Oct. 30, 2020, 4(1):e10143, 19 pages.

ChristopheGuberan.ch [online], "Hydro-Fold," available on or before Feb. 8, 2015 via Internet Archive: Wayback Machine URL<https://web.archive.org/web/20150208090747/http://www.christopheguberan.ch/hydro-fold/>, retrieved on Oct. 12, 2021, retrieved from URL<http://www.christopheguberan.ch/hydro-fold/>, 3 pages.

Guo et al., "Directed Printing and Reconfiguration of Thermoresponsive Silica-pNIPAM Nanocomposites," Macromol. Rapid Communications, Jun. 4, 2019, 40(13):1900191, 9 pages.

Kao et al., "SkinMorph: Texture-Tunable On-Skin Interface Through Thin, Programmable Gel," Presented at Proceedings of UbiComp '18: The 2018 ACM International Joint Conference on Pervasive and Ubiquitous Computing, Singapore, Singapore, Oct. 8-12, 2018; ISWC '18: Proceedings of the 2018 ACM International Symposium on Wearable Computers, Oct. 2018, 196- 203.

Miruchna et al., "GelTouch: Localized Tactile Feedback Through Thin, Programmable Gel," Presented at Proceedings of UIST '15: The 28th Annual ACM Symposium on User Interface Software and Technology, Charlotte, NC, USA, Nov. 11-15, 2015; UIST '15: Proceedings of the 28th Annual ACM Symposium on User Interface Software & Technology, Nov. 2015, 3-10.

Moon et al., "Morphology of inkjet-printed lines of a thermoresponsive hydrogel: jetting speed vs dehydration speed," Presented at Proceedings of the International Conference of Manufacturing Technology Engineers (ICMTE) 2018, Seoul, Korea, Oct. 2-5, 2018, 66.

Nishiyama et al., "Development of a Three-Dimensional Bioprinter: Construction of Cell Supporting Structures Using Hydrogel and State-Of-The-Art Inkjet Technology," J. Biomech. Engineering, Mar. 2009, 131(3):035001, 6 pages.

Rivera et al., "Hydrogel-Textile Composites: Actuators for Shape-Changing Interfaces," Presented at Proceedings of the CHI '20: CHI Conference on Human Factors in Computing Systems, Honolulu, HI, USA, Apr. 25-30, 2020; CHI EA '20: Extended Abstracts of the 2020 CHI Conference on Human Factors in Computing Systems, Apr. 2020, LBW054, 9 pages.

Wang et al., "Inkjet printed colloidal photonic crystal microdot with fast response induced by hydrophobic transition of poly(N-isopropyl acrylamide)," J. Mater. Chemistry, Jun. 26, 2012, 22(40):21405-21411.

Wang et al., "Printed Paper Actuator: A Low-cost Reversible Actuation and Sensing Method for Shape Changing Interfaces," Presented at Proceedings of the 2018 CHI Conference on Human Factors in Computing Systems, Montreal, Quebec, CA. Apr. 21-26, 2018; CHI '18: Proceedings of the 2018 CHI Conference on Human Factors in Computing Systems, Apr. 2018, Paper 569, 12 pages.

Wang et al., "Smart hydrogels for 3D bioprinting," Int. J. Bioprinting, Jul. 2, 2015, 1(1):3-14.

Yang et al., "Inkjet printing based assembly of thermoresponsive core-shell polymer microcapsules for controlled drug release," J. Mat. Chem. B, May 4, 2016, 4(23):4156-4163.

Yao et al., "bioLogic: Natto Cells as Nanoactuators for Shape Changing Interfaces," Presented at Proceedings of CHI '15: CHI Conference on Human Factors in Computing Systems, Seoul, Korea, Apr. 18-23, 2015; CHI '15: Proceedings of the 33rd Annual ACM Conference on Human Factors in Computing Systems, Apr. 2015, 10 pages.

* cited by examiner

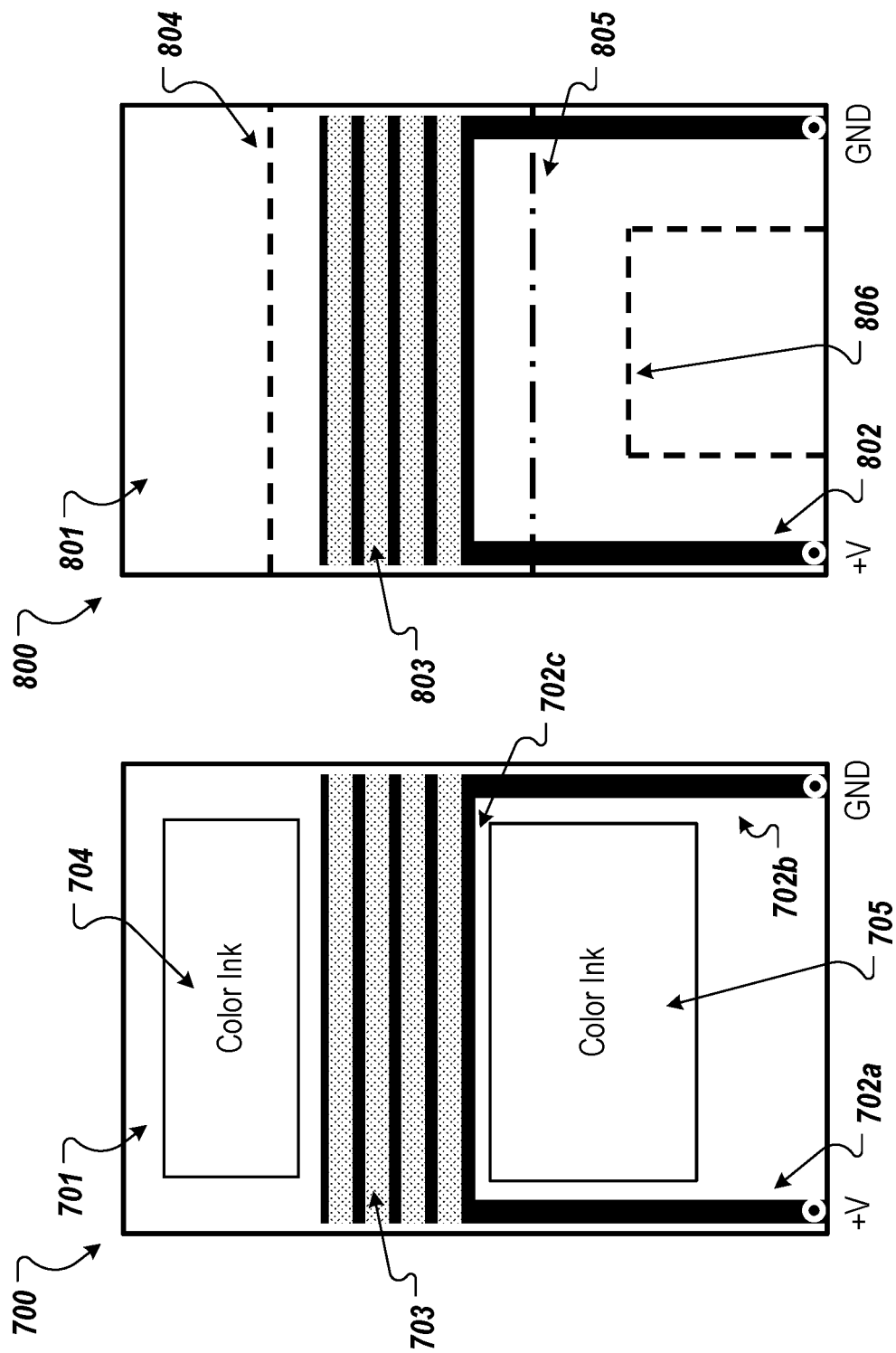

CREATING MORPHING OBJECTS BY INKJET PRINTING THERMORESPONSIVE HYDROGELS

CROSS-REFERENCE TO RELATED APPLICATION

This application claims the benefit of U.S. Provisional Application No. 63/105,410, filed Oct. 26, 2020, and titled "Creating Morphing Objects by Inkjet Printing Hydrogels," which is incorporated herein by reference.

TECHNICAL FIELD

This specification generally relates to morphing objects and creating morphing objects by printing thermoresponsive hydrogels onto substrates.

BACKGROUND

Inkjet printing is a printing technique that is used for both personal printing and industrial/commercial applications. Personal inkjet printers are used to print with black or colored inks that are used to display text or images. Inkjet printers work by spraying liquid ink onto paper.

Hydrogels are a class of smart materials whose material properties can be changed by the amount of water that is absorbed at a given time. Hydrogels can absorb large amounts of water while maintaining their defined structures.

SUMMARY

This specification generally describes morphing objects that are created using thermoresponsive hydrogels and techniques for creating and controlling the morphing objects. When thermoresponsive hydrogels, which are also referred to simply as hydrogels in this document for brevity, are applied to, e.g., printed onto various substrates, the swelling and deswelling (e.g., shrinking) of the hydrogel can cause movement or "morphing" of the end product. For example, the swelling of a line of hydrogel on a sheet of paper can cause the sheet of paper to fold along the line.

Swelling and deswelling of the hydrogel can be caused by a change in heat from one or more sources including, but not limited to, one or more conductive traces disposed on the substrate, e.g., between the substrate and the hydrogel. In this example, a controller can control the amount of current flowing on the conductive traces to control the amount of heat dissipated by the conductive traces and thereby control the swelling of the hydrogels and the morphing of the substrate. The controller can apply current to different traces in a particular order to morph the substrate into a particular shape.

An inkjet printer can be used to print the hydrogel and, if used, the conductive trace onto the substrate, e.g., a sheet of paper. This enables precise control over the arrangement of the hydrogels and conductive trace(s) on the substrate and therefore precise control over the morphing of the substrate into a particular shape. This also enables users to create designs and create morphing products based on the design with existing and readily available tools, e.g., drawing software and existing inkjet printers. The hydrogels can be selected and/or adapted for use in existing inkjet cartridges such that modification of the inkjet printer and/or the cartridges is not required.

According to some implementations, a method for creating a morphing material includes creating one or more heating elements on a substrate by applying one or more conductive traces onto at least one of a first surface of the substrate or a second surface of the substrate opposite the first surface and forming a hydrogel pattern on the first surface of the substrate by applying a hydrogel ink to the first surface of the substrate based on a predefined pattern.

Implementations can include one or more of the following features. In some aspects, applying the one or more conductive traces includes printing, by an inkjet printer, a conductive ink on the at least one first surface or second surface and forming the hydrogel pattern on the first surface of the substrate can include printing, by the inkjet printer, the hydrogel on the first surface in the predefined pattern. Some aspects can include forming an encapsulation layer over the hydrogel pattern by applying encapsulation ink over the hydrogel ink. The encapsulation layer can include a hydrophobic material. The inkjet printer can include a first ink source that includes conductive ink, a second ink source that includes hydrogel ink, a third ink source that includes encapsulation ink, and a fourth ink source that includes color ink. In some aspects, the hydrogel ink includes a combination of a hydrogel and a photoinitiator. The photoinitiator can include 2,2-Diethoxyacetophenone (DEAP). In some aspects, the inkjet printer is installed in an isolated box with a light source for crosslinking the hydrogel ink.

Some aspects include forming an additional hydrogel pattern on the second surface of the substrate by applying the hydrogel to the second surface of the substrate based on an additional predefined pattern. In some aspects, the substrate includes paper, waxed traces paper, a clear projector sheet, or inkjet tattoo paper.

In some aspects, the hydrogel includes at least one of a Poly(N-isopropylacrylamide) (PNIPAM) hydrogel or a combination of two or more of N-Isopropylacrylamide, N,N'-Methylenebisacrylamide, 2,2-Diethoxyacetophenone, distilled water, Ethylene Glycol, and sodium dodecyl sulfate. In some aspects, the one or more conductive traces include at least one conductive trace having a different width than another conductive trace. The one or more conductive traces an include a first conductive trace formed using a first conductive ink having a first resistance and a second trace formed using a second conductive trace having a second resistance different from the first resistance. Some aspects include connecting a controller to the one or more conductive traces.

According to some implementations, a morphing object includes a substrate having a first surface and a second surface, a hydrogel pattern that includes one or more hydrogel traces disposed on the first surface of the substrate, and one or more conductive traces disposed on at least one of the first surface or the second surface of the substrate.

Some implementations include a controller configured to selectively apply electrical current to the one or more conductive traces to activate the hydrogel and change the shape of the morphing object. The hydrogel can include a Poly(N-isopropylacrylamide) (PNIPAM) hydrogel.

In some aspects, the hydrogel includes a combination of two or more of N-Isopropylacrylamide, N,N'-Methylenebisacrylamide, 2,2-Diethoxyacetophenone, distilled water, Ethylene Glycol, and sodium dodecyl sulfate. Some aspects include an encapsulation layer formed by printing encapsulation ink over the hydrogel pattern. In some aspects, the hydrogel traces include hydrogel ink printed on the first surface of the substrate and the one or more conductive traces comprise conductive ink printed on the at least one first or second surface of the substrate.

According to some implementations, an inkjet printer system includes a conductive ink source comprising conductive ink, a hydrogel ink source comprising hydrogel ink and a processor. The processor is configured to perform operations that include creating one or more heating elements on a substrate by applying one or more conductive traces of the conductive ink onto at least one of a first surface of the substrate or a second surface of the substrate opposite the first surface and forming a hydrogel pattern on the first surface of the substrate by applying the hydrogel ink to the first surface of the substrate based on a predefined pattern. Some aspects include an encapsulation ink source that includes encapsulation ink and a color ink source that includes color ink.

The methods in accordance with the present disclosure can include any combination of the aspects and features described herein. That is, methods in accordance with the present disclosure are not limited to the combinations of aspects and features specifically described herein, but also may include any combination of the aspects and features provided.

The subject matter described in this specification can be implemented in particular embodiments so as to realize one or more of the following advantages. Using hydrogels and conductive traces, reversibly self-folding origami-like structures can be created that enable a myriad of applications, including origami actuators, ambient shape-changing displays, and texture-changing inputs with variable friction and haptics. Compared to other works leveraging thermoresponsive materials, the much lower activation temperature of shape-memory hydrogels affords a combination of responsiveness to body heat, lower power requirements for resistive heating using conductive traces, and faster activation speeds. Printing hydrogels and conductive ink using inkjet printing enables precise control over the arrangement of the hydrogels and conductive trace(s) on the substrate, enables users to create designs and create morphing products based on the design with existing and readily available tools, e.g., drawing software and existing inkjet printers, and in some cases does not require modification of the inkjet printer and/or inkjet cartridges. An encapsulation layer can also be printed over the hydrogel to prevent the hydrogel from drying due to exposure to the environment.

The details of one or more implementations of the present disclosure are set forth in the accompanying drawings and the description below. Other features and advantages of the present disclosure will be apparent from the description and drawings, and from the claims.

BRIEF DESCRIPTION OF THE DRAWINGS

FIG. 7 depicts components of an example morphing object.
FIG. 8 depicts components of an example morphing object.

DETAILED DESCRIPTION

This specification generally describes morphing objects that are created using hydrogels and techniques for creating the morphing objects. The morphing objects can reversibly change shape based on the amount of water absorbed or released by hydrogels applied to, e.g., printed on, a substrate. When the hydrogel is hydrated, the hydrogel swells and the substrate can remain flat. When the hydrogel is dehydrated (e.g., when heat is applied), the hydrogel shrinks, pulling the underlying substrate along its path of least resistance causing the substrate to bend or fold. Rehydration of the hydrogel causes the substrate to revert to its flat or as printed state. The shape change of the morphing objects can be controlled by applying conductive traces on a same substrate as the hydrogels. The conductive traces act as a heating element that controls the amount of water released by the hydrogels, and therefore controls the shape change of the morphing object. This can be reversed by rehydrating the polymer through misting, spraying, or other appropriate methods. The conductive traces and/or hydrogel traces can be printed onto a substrate using an inkjet printer.

Figure 1:
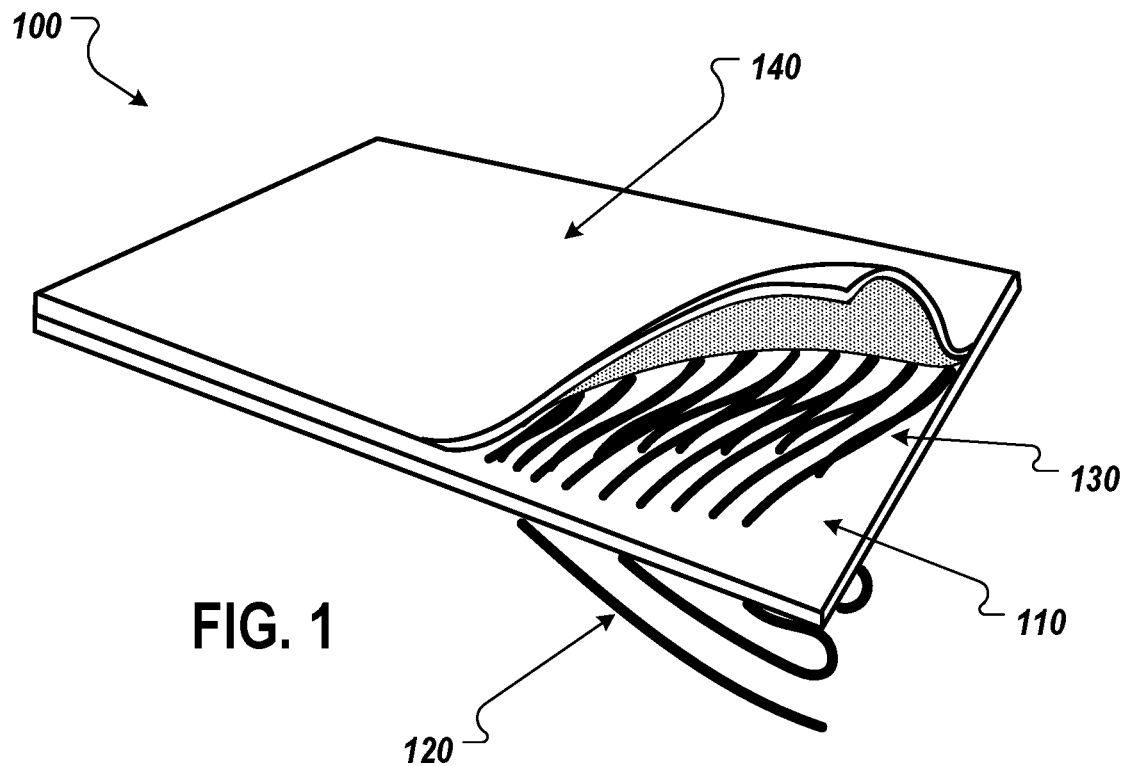
FIG. 1 depicts an example morphing object.

FIG. 1 depicts an example morphing object 100. The morphing object 100 includes a substrate 110, hydrogel traces 130, conductive traces 120, and an encapsulation layer 140. The substrate 110—what the hydrogel is directly printed on—is important for bending actuation of the hydrogel. As the hydrogel shrinks when heat is applied while the substrate does not shrink, this pulls the textile of the substrate 110 causing a macroscopic bending behavior. Different effects can be achieved by changing the material and the material properties of the substrate 110.

The substrate 110 can be a sheet of plain paper (e.g., printer or copy paper), a sheet of waxed traces paper, a clear projector sheet, a sheet of inkjet tattoo paper, Polyethylene terephthalate (PET), mesoporous printing media, or another appropriate substrate onto which hydrogels can be applied. For inkjet printer implementations, the substrate 110 can be paper or other substrates capable of use with an inkjet printer. The thin and light nature of waxed traces paper produces dramatic actuation compared to other substrates and the wax chemical treat acts as a sealant, which prevents moisture in the hydrogel from being wicked into the paper. The clear projector sheeting can be used for applications where transparency of the substrate 110 is desired. The inkjet tattoo paper can be used for on-body applications, e.g., for morphing objects that are worn by people and that are actuated by the person's body temperature, and can encapsulate a hydrogel and/or conductive trace pattern between two layers of inkjet woven textiles.

Figure 3:
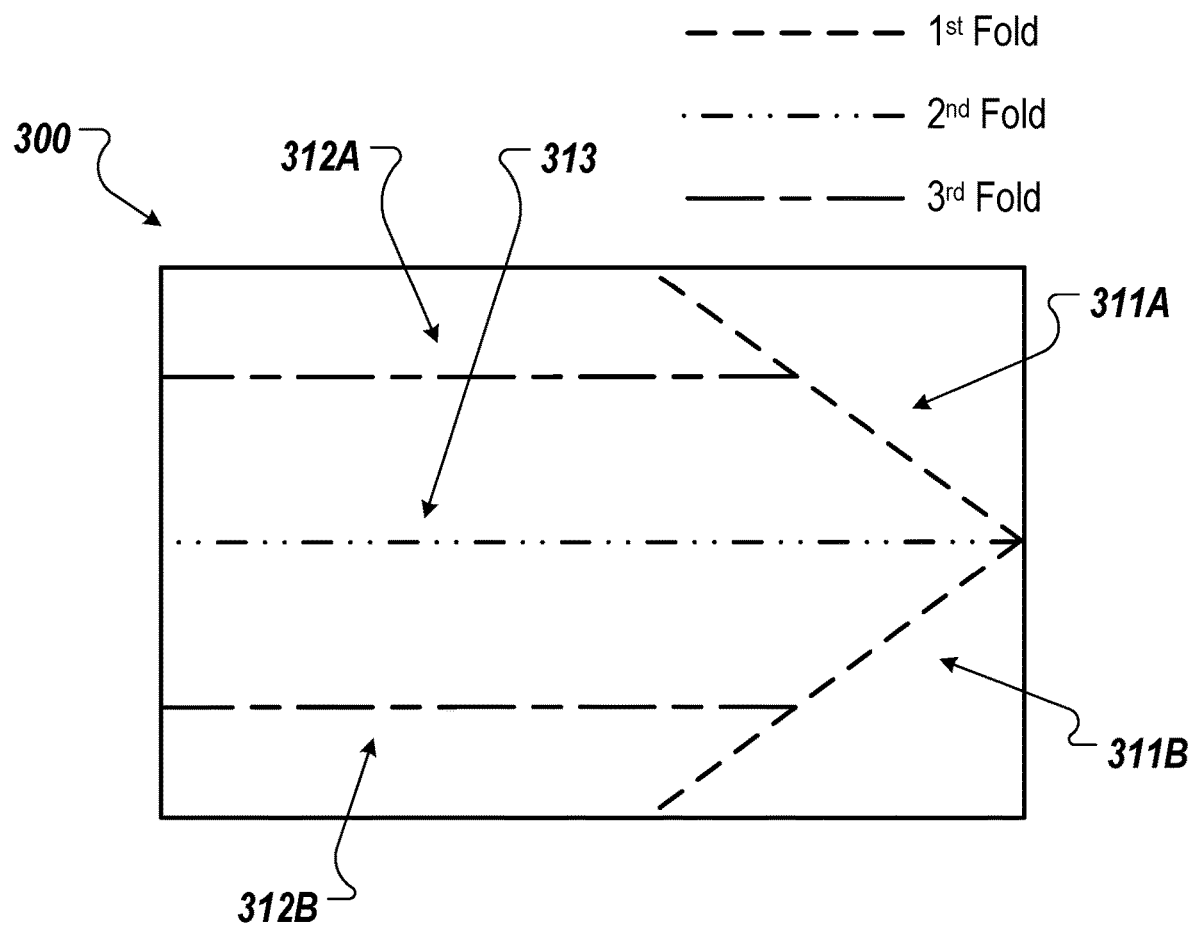
FIG. 3 depicts an example morphing object with fold lines at which hydrogels are located.
Figure 6:
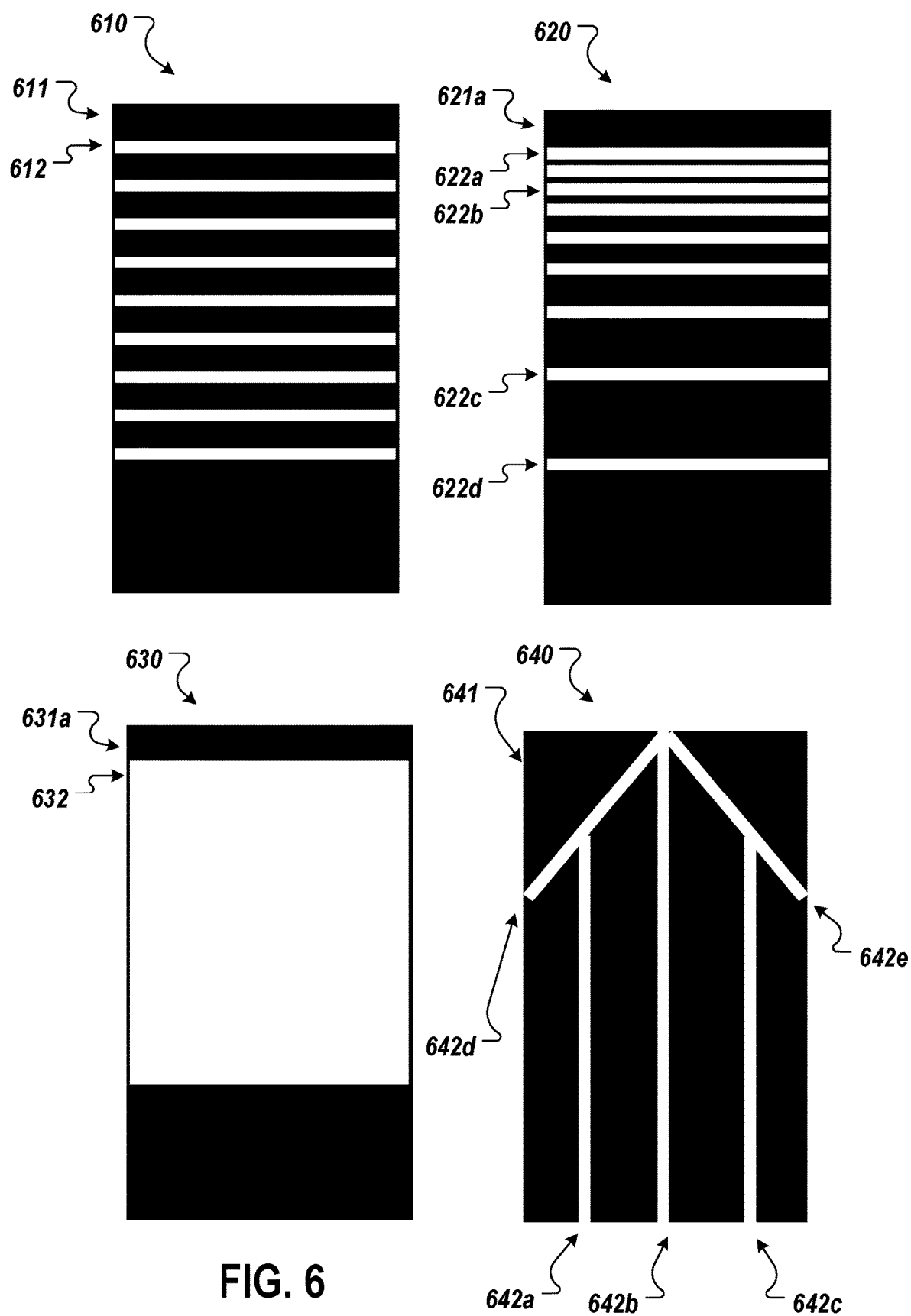
FIG. 6 depicts example hydrogel patterns for morphing objects.

The hydrogel traces 130 can be applied to one or both surfaces of the substrate 110. The hydrogel traces 130 can be arranged in a hydrogel pattern that defines how the substrate 110 changes shape when the hydrogel traces 130 are heated. An example hydrogel pattern for a paper airplane is shown in FIG. 3 and described below. Additional hydrogel patterns are shown in FIG. 6. Additional morphing objects that can be created using hydrogel patterns applied to substrates are also described below.

In some implementations, an inkjet printer applies the hydrogel traces 130 to one or both surfaces of the substrate 110. For example, the inkjet printer can include an inkjet cartridge that contains a hydrogel in a non-viscous liquid state. The example hydrogels described in this document can be used in standard inkjet cartridges, e.g., without modification of the cartridges.

In some implementations, the hydrogel is a thermoresponsive Poly(N-isopropylacrylamide) (PNIPAM) hydrogel. This allows for the printing in a non-viscous liquid state. A chemical reactant (ammonium persulfate) can be added to initiate a PNIPAM hydrogel. However, this is incompatible for inkjet printing, as the hydrogel would cure in the printer and clog the printer. Instead, a photoinitiator, which is a chemical that only becomes activated when exposed to ultraviolet (UV) light, can be used. This allows the photopolymer resin to stay liquid in the printer, and only cured after printing in a UV curing stage. At its lower critical solubility temperature (LCST), the hydrogel undergoes a phase transition from a hydrophilic material to a hydrophobic one. Because of this, the hydrogel expels water, shrinks, and becomes a rubber-like material. This is because at room temperature the hydrogel network of hydrogel traces forms hydrogen bonds with water (enthalpically favorable) which overpowers the water's preference for free random movement (entropically favorable). However, as the temperature increases, the water molecules have more energy, and the hydrogen bonds are no longer favorable. This behavior allows a significant increase in actuation speed compared to other hydrogels.

The hydrogel of the hydrogel traces 130 can include a combination of N-Isopropylacrylamide (NIPAM), N,N'-Methylenebisacrylamide (BIS), 2,2-Diethoxyacetophenone (DEAP), distilled water, Ethylene Glycol (EG), and/or sodium dodecyl sulfate. The NIPAM is made of small molecules that, once initiated, bond together to form long polymer chains with thermoresponsive properties. The BIS is a monomer present in a much lower concentration than NIPAM that, once initiated, tethers between PNIPAM chains to make a 3-dimensional gel network, causing the resin to solidify. The DEAP is a responsive molecule that, once exposed to UV light, breaks down to form free radicals, initiating the crosslinking process. Other photoinitiators can be used, but this photoinitiator is liquid allowing for easy complete mixing. The distilled water is the main solvent, dissolving and mixing the other ingredients to form a liquid ink. The EG is a water retaining agent that prevents the ink from drying before curing is complete. Sodium dodecyl sulfate is a common surfactant (used in soap and toothpaste) that is added in a small amount to accelerate and improve mixing of the combination.

Because of its physiologically relevant response temperature, PNIPAM hydrogels are well-studied in biomedical engineering, particularly for applications such as targeted drug delivery. As such, PNIPAM hydrogel's biocompatibility is well characterized. Similar to a stereolithography 3D printing resin, PNIPAM hydrogel is biocompatible and non-hazardous for skin contact once completely cross linked but should not have direct skin contact in the resin state. Since it is difficult to achieve 100% crosslinking, there are two main methods to ensure safety: 1) encapsulate in membrane (like silicon) and 2) soak the PNIPAM hydrogel in distilled water overnight, changing the water multiple times. As very little material is actually used in the printing, large levels of exposure are generally not considered to be a potential hazard.

The conductive traces 120 can be formed using conductive ink, e.g., silver nanoparticle ink. In some implementations, an inkjet printer can print the conductive traces 120 on one or both surfaces of the substrate 110. For example, the conductive traces 120 can be arranged in the same pattern as the hydrogel traces 130 and either applied to, e.g., printed on, the same surface of the substrate 110 or onto the opposite surface of the substrate. The conductive ink can be applied to, e.g., printed on, the substrate in the form of pads of winding conductive traces or other unique shapes of conductive traces. For example, a rectangular printed circuit can heat a rectangular hydrogel that curls into a cylinder.

Similar to the hydrogel, the conductive ink can be used in standard inkjet cartridges, e.g., without modification of the cartridges, and/or in other ink supply sources for inkjet printers, e.g., in refillable ink tank inkjet printers. As described in more detail below, a controller can apply an electrical current to the conductive traces to activate the hydrogel of the hydrogel traces 130 and cause the morphing object 100 to change shape. In this way, the conductive traces act as a resistive heating element.

All hydrogels have a tendency to dry out if left exposed in air. Once that happens, the hydrogel loses its temperature responsiveness and will stay shrunken. For applications where this is not desired, this can be avoided by encapsulating the hydrogel in an encapsulation layer 140, e.g., an encapsulation layer made of a hydrophobic material that retains moisture. One example way of encapsulating the hydrogel is airbrushing a thin coat of liquid latex, as it dries transparent and is highly flexible so it does not impede actuation.

The encapsulation layer 140 also prevents direct skin contact with the hydrogels. In some applications, direct contact with the hydrogel may be desired, e.g., when the hydrogel is used to change the friction of a surface that is rubbed by a person or device (e.g., mouse) controlled by the person. To enable this, the uncrosslinked reactants and monomers can be removed from the hydrogel. This can be achieved by soaking the substrate 110 with the hydrogel traces 130 applied thereon in water, e.g., for 24 hours with multiple water changes. This is best suited for plastic substrate, but paper substrates can be used if handled gently and carefully allowed to dry.

To create the morphing object 100, a user can create a hydrogel pattern, e.g., using a software application. For example, a graphic design application can be used to draw lines that represent the hydrogel traces 130. In this example, the hydrogel lines can be a particular color corresponding to a particular inkjet cartridge, e.g., the cyan cartridge, that has been replaced with an inkjet cartridge that includes the hydrogel. In this way, the inkjet printer prints the hydrogel in place of the particular color to form a hydrogel pattern that matches the hydrogel lines defined by the user. In another example, a morphing object-specific application can be used to define the hydrogel patterns and control which inkjet cartridges are used by the inkjet printer to print the hydrogel onto the substrate 110.

An inkjet printer can print the hydrogel traces 130 onto the substrate 110 according to the user-defined hydrogel pattern. The inkjet printer can also print the conductive traces according to the hydrogel pattern, e.g., on the same surface of the substrate as the hydrogels or on the opposite surface. After printing the hydrogel onto the substrate, the hydrogel can be allowed to cure, e.g., by applying UV light to the hydrogel.

After curing, some post-processing of the morphing object 100 can be performed. For example, an encapsulation layer 140 can be applied by airbrushing a thin layer of a coating over the surface(s) of the substrate 110 on which the hydrogel traces 130 are printed. Post-processing can include folding and/or creasing the substrate 110. Folding the substrate 110 can be formed to make origami-like structures that have morphing elements. Folding the substrate 110 along the hydrogel trace line allows sharper bends during hydrogel actuation.

The morphing object 100 can include a controller that selectively applies an electrical current to the conductive traces 120 to heat the hydrogel traces 130 and to cause the morphing object to change shape. In some implementations, the controller can be a switch that, when activated, connects a battery to the conductive traces. This can be used when the application does not require the hydrogel traces to be activated in a particular sequence.

In some implementations, the controller can be a microcontroller or microprocessor that applies current to the hydrogel traces 130 in a sequence or adjusts the amount of current on each hydrogel trace 130 to control when each hydrogel trace 130 is activated and how quickly each hydrogel trace 130 is activated. In this way, more complex shapes that require multiple sequential folds are possible. In another example, the conductive traces 120 have differing widths to vary the amount of heat produced by each conductive trace 120 and therefore control when and/or how fast each hydrogel trace 130 is activated.

Figure 2:
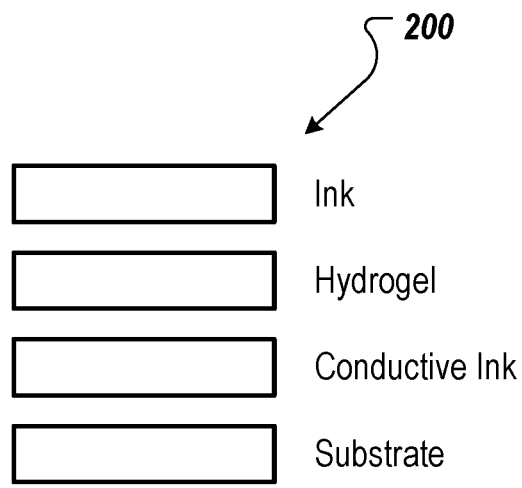
FIG. 2 depicts layers of a morphing object.

FIG. 2 depicts layers of a morphing object 200. In this example, the morphing object 200 includes conductive ink applied to a surface of a substrate, hydrogel applied over the conductive ink, and normal ink (e.g., for text or graphics) applied to the surface of the substrate. This morphing object 200 can be printed by an inkjet printer in one pass. For example, traditional inkjet printers have four ink cartridges (black, cyan, magenta, and yellow). Conductive ink can be printed as one layer and a hydrogel as another layer just as a normal print can combine colors or print different colors on a different part of the page. In addition, silicon encapsulation ink can be applied over the hydrogel to create the encapsulation layer. In this example, there could be one color ink cartridge, one hydrogel ink cartridge, one conductive ink cartridge, and one encapsulation ink cartridge.

An inkjet printer can also be manufactured with more than four ink cartridges. For example, an inkjet printer could have seven ink cartridges, including the four standard black, cyan, magenta, and yellow cartridges, a conductive ink cartridge, a hydrogel cartridge, and optionally an encapsulation ink cartridge.

FIG. 3 depicts an example morphing object 300 with fold lines 311-313 at which hydrogels are located. In this example, the hydrogel pattern defined by the fold lines 311-313 enable the morphing object to morph from a flat piece of paper to a paper airplane. The morphing object 300 can also include a conductive trace under the hydrogel of each fold line to act as a heating element for the hydrogel.

A controller can activate the hydrogel of the fold lines in a sequence to change the shape of the morphing object to the paper airplane. In particular, the controller can first apply an electrical current to the conductive traces of the first fold lines 311A and 311B causing the paper to fold along the lines 311A and 311B. Next, the controller can apply an electrical current to the conductive traces of the second fold lines 312A and 312B causing the paper to fold along the lines 312A and 312B. Finally, the controller can apply an electrical current to the third fold line 313 causing the paper to fold along the line 313 and forming a paper airplane.

In some implementations, the direction of the hydrogel lines that allow for folding to occur might be different from the intended fold lines. Because the hydrogel contracts, there might be multiple short perpendicular conductive ink traces and respective hydrogel traces perpendicular to the fold line to enable the intended fold.

Figure 4:
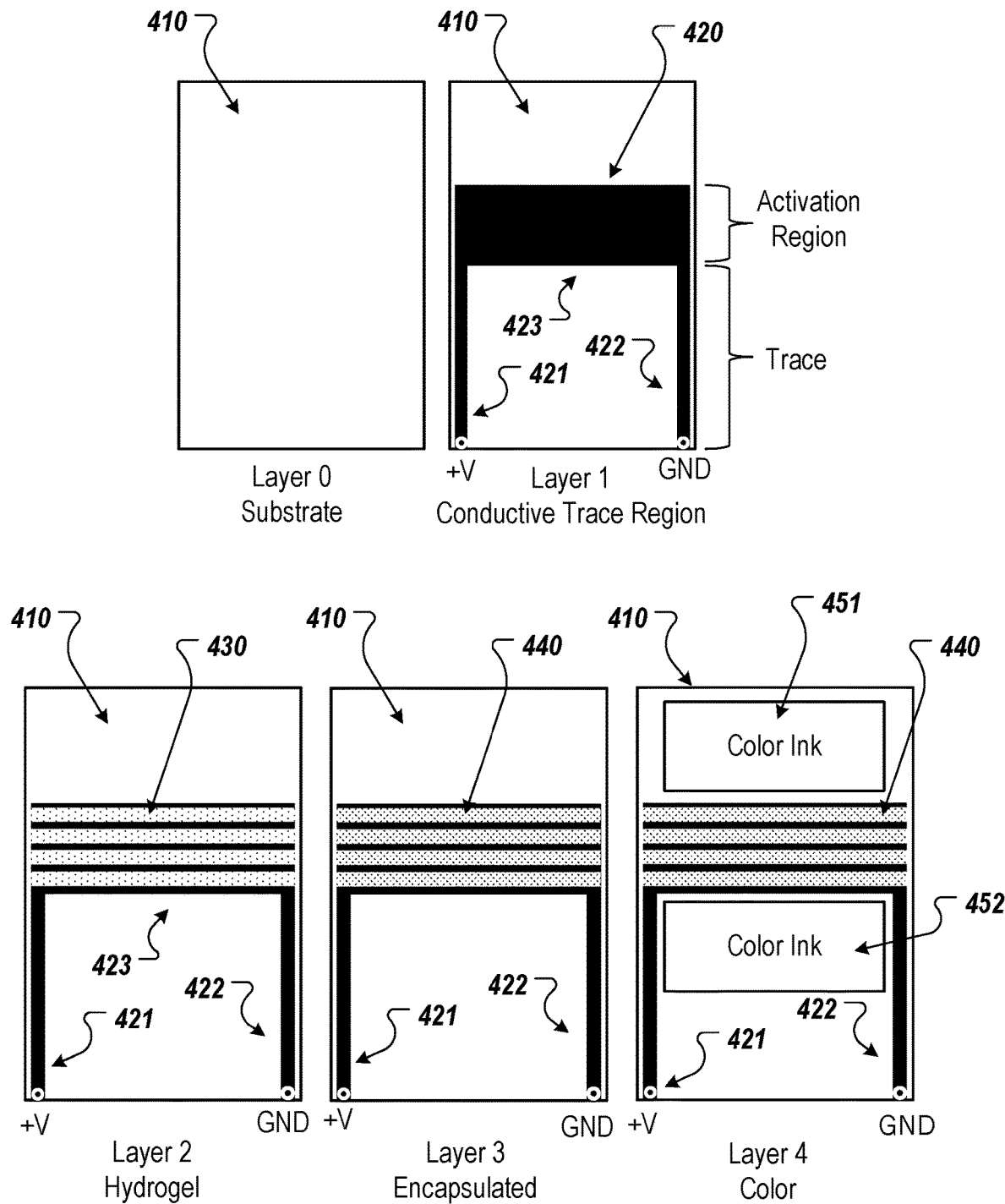
FIG. 4 depicts layers of an example morphing object.

FIG. 4 depicts layers of an example morphing object. The first layer (layer 0) of the morphing object is a substrate 410, e.g., paper, plastic, or other appropriate substrate as described above. A second layer (layer 1) includes conductive ink 420 that is printed onto a surface of the substrate 410. The conductive ink 420 can include a first conductive trace 421 that can be connected to a positive output of a voltage source (e.g., a +5 VDC or +12 VDC terminal), a second conductive trace 422 that can be connected to ground of the voltage source, and a conductive trace pattern 423 that forms the heating element for the morphing object. The conductive traces 421 and 422 can be connected to electrical connectors, e.g., contacts, to which the voltage control outputs of a controller for activating and deactivating the hydrogels is connected.

Figure 5:
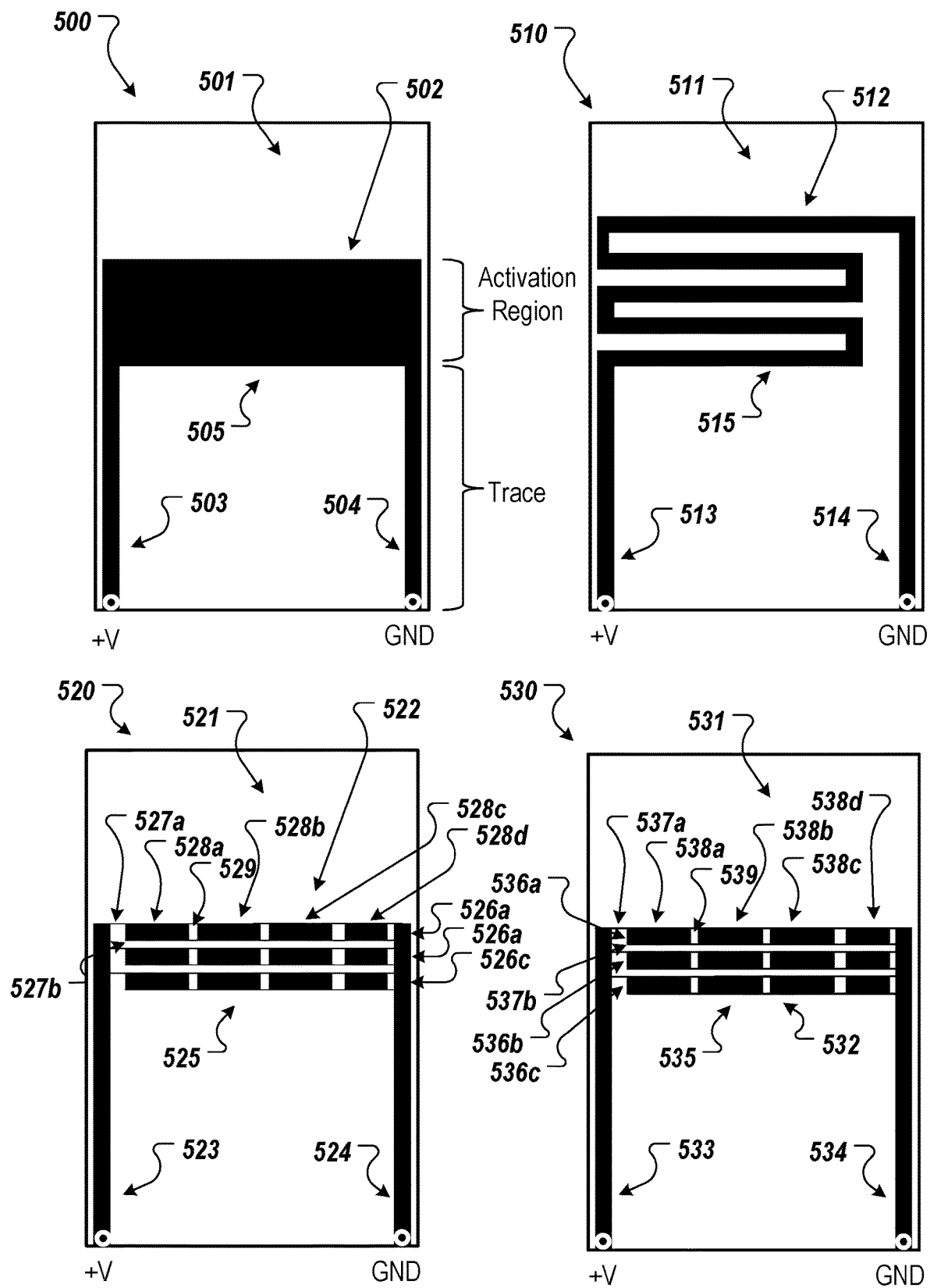
FIG. 5 depicts example heating element patterns for morphing objects.

The conductive trace pattern 423 can have many different arrangements of traces that can be designed based on the target folding sequence for the morphing object. The conductive trace pattern 423 forms an activation region for activating a hydrogel layer. Some example trace patterns are shown in FIG. 5 and described below.

A third layer (layer 2) of the morphing object includes hydrogel ink 430 printed on a surface of substrate. The hydrogel ink 430 can be printed on the same surface as the conductive ink and/or the opposite surface of the substrate 410. The hydrogel ink 430 is printed onto the surface in a pattern based on the target folding sequence for the morphing object.

A fourth layer (layer 3) of the morphing object is an encapsulation layer that can be formed by printing an encapsulation ink 440 onto the same surface of the substrate 410 as the hydrogel ink 430. The encapsulation ink 440 can be applied over the hydrogel ink 430, e.g., to cover all of the hydrogel ink 430 and prevent the hydrogel ink from drying due to exposure to the environment. The encapsulation ink 440 can be silicon, latex, or another appropriate encapsulation substance that can be applied as a liquid over the hydrogel ink 430 and allowed to dry to form, in combination with the substrate 410, a seal around the hydrogel ink 430.

A fifth layer (layer 4) of the morphing object includes color ink printed onto a surface of the substrate 410. In this example, there are two locations 451 and 452 on the surface of the substrate 410 at which color ink is applied. The color ink can be used to print a logo, instructions for pre-folding the substrate 410, as described below, to print words or drawings of an interactive morphing book, and/or to print other designs on the substrate 410.

FIG. 5 depicts example heating element patterns for morphing objects 500, 510, 520, and 530. A first morphing object 500 includes a substrate 501, a heating element 502, a hydrogel pattern (not shown) formed using hydrogels, and optionally an encapsulation layer (not shown) formed using encapsulation ink. The heating element 502 includes a first conductive trace 503 that can be connected to a positive voltage terminal, a second conductive trace 504 that can be connected to a ground terminal, and a conductive trace pattern 505. In this example, the conductive trace pattern can be a single area of conductive ink that extends from the first conductive trace 503 to the second conductive trace 504. To activate the hydrogel, current flows between the conductive traces 503 and 504 through the conductive trace pattern 505.

A second morphing object 510 includes a substrate 511, a heating element 512, a hydrogel pattern (not shown) formed using hydrogels, and optionally an encapsulation layer (not shown) formed using encapsulation ink. The heating element 512 includes a first conductive trace 513 that can be connected to a positive voltage terminal, a second conductive trace 514 that can be connected to a ground terminal, and a conductive trace pattern 515. In this example, the conductive trace pattern 515 includes parallel conductive traces that follow a meandering path running back.

A third morphing object 520 includes a substrate 521, a heating element 522, a hydrogel pattern (not shown) formed using hydrogels, and optionally an encapsulation layer (not shown) formed using encapsulation ink. The heating element 522 includes a first conductive trace 523 that can be connected to a positive voltage terminal, a second conductive trace 524 that can be connected to a ground terminal, and a conductive trace pattern 525. In this example, the conductive trace pattern 525 includes three parallel arrays 526a-526c of heating components that each extends from the first conductive trace 523 to the second conductive trace 524.

Each heating array 526a-526c includes a first conductive path 527a and a second conductive path 527b that connects four individual heating components 528a-528d. Each individual heating component 528a-528d can include printed conductive ink, e.g., the same conductive ink as the conductive traces 523 and 524. In this example, there are spaces 529 (shown in white) between the first conductive trace 523 and the first individual heating component 528a of each heating array 526a-526c and, a space 529 between each pair of individual heating components 528a-528d, and a space 529 between the second conductive trace 524 and the last individual heating component 528d of each heating array 526a-526c. The spaces 529 do not include conductive ink. This arrangement provides a Positive Temperature Coefficient (PTC) heater effect. Although there are three parallel heating arrays 526a-526c and four individual heating components in this example, other appropriate quantities of heating arrays and individual heating components in the arrays can be used.

The parallel heating arrays 526a-526c of the conductive trace pattern 525 heat in parallel based on their parallel connections to the conductive traces 523 and 524. In this example, the parallel heating arrays 526a-526c will effectively heat up simultaneously. In contrast, the parallel conductive traces of the conductive traces pattern 515 heat up in series. That is, the heat would move through the trace in the pattern that the trace is printed, providing a different effect than the parallel heating arrays 526a-526c of the trace pattern 525.

A fourth morphing object 530 includes a substrate 531, a heating element 532, a hydrogel pattern (not shown) formed using hydrogels, and optionally an encapsulation layer (not shown) formed using encapsulation ink. The heating element 532 includes a first conductive trace 533 that can be connected to a positive voltage terminal, a second conductive trace 534 that can be connected to a ground terminal, and a conductive trace pattern 535. In this example, the conductive trace pattern 535 includes three parallel arrays 536a-536c of heating components that each extends from the first conductive trace 533 to the second conductive trace 534.

Each heating array 536a-536c includes a first conductive path 537a and a second conductive path 537b that connects four individual heating components 538a-538d. Each individual heating component 538a-538d can include printed conductive ink, e.g., the same conductive ink as the conductive traces 533 and 534. In this example, there are spaces 539 (shown in white) between the first conductive trace 533 and the first individual heating component 538a of each heating array 536a-536c and, a space 539 between each pair of individual heating components 538a-538d, and a space 539 between the second conductive trace 534 and the last individual heating component 538d of each heating array 536a-536c. The spaces 539 do not include conductive ink. This arrangement provides a PTC heater effect. Although there are three parallel heating arrays 536a-536c and four individual heating components in this example, other appropriate quantities of heating arrays and individual heating components in the arrays can be used.

The conductive ink of the individual heating component 538a-538d is different from the conductive ink of the conductive traces 523 and 524. For example, the conductive ink of the individual heating component 538a-538d can have a different resistance than the conductive ink of the conductive traces 533 and 534. This can be used to better control the amount of heat dissipated by the heating element 532. This can also be used to ensure that only the specific area of the individual heating component 538a-538d are heated.

In some implementations, conductive traces of the heating element can have different resistance conductive inks. For example, a first conductive trace that follows a first line of hydrogel ink for a first fold of the morphing object can have a different resistance than a second conductive trace that follows a second line of hydrogel ink for a second fold of the morphing object. In this way, the different resistances can be used to produce different amounts of heat such that one of the folds happens before or faster than the other fold. Each conductive ink can be applied from a different ink source, e.g., from a different ink cartridge. In a four cartridge inkjet printer, the encapsulation ink cartridge and/or color ink cartridge can be replaced by another conductive ink cartridge, depending on the morphing objects being created.

Although some example heating element designs are shown in FIG. 5, many other designs are possible. For example, circular, rectangular, and/or free formed patterns can be used. In a particular example, the heating element can include one or more traces that follow the fold lines, e.g., the hydrogel ink lines, for the morphing object.

FIG. 6 depicts example hydrogel patterns 610, 620, 630, and 640 for morphing objects. The hydrogel patterns 610, 620, 630, and 640 can be formed by printing hydrogel ink onto a surface of a substrate layer of the morphing object.

A first hydrogel pattern 610 includes parallel lines of hydrogel ink 612 printed on a substrate. A heating element formed using conductive ink 611 can be located below the first hydrogel pattern 610, and is visible between each pair of adjacent hydrogel lines.

A second hydrogel pattern 620 also includes parallel lines of hydrogel ink 622 printed on a substrate. A heating element formed using conductive ink 621 can be located below the first hydrogel pattern 610, and is visible between each pair of adjacent hydrogel lines. In this example, the spacing between the hydrogel lines differs for different pairs of hydrogel lines. For example, the space between hydrogel lines 622a and 622b is smaller than the space between hydrogel lines 622c and 622d. The hydrogel pattern 620 will create a non-uniform shape while the hydrogel pattern 610 will create a uniform shape. Depending on which direction the fold would occur, the hydrogel pattern 610 might create a semi-circular shape, while the hydrogel pattern 620 would create a half water drop shape.

A third hydrogel pattern 630 also includes a rectangular hydrogel area 630 that includes hydrogel ink throughout the rectangular hydrogel area 632. A heating element formed using conductive ink 621 can be located below the first hydrogel pattern 610, and is visible above and below the rectangular hydrogel area 632. This hydrogel pattern 630 can be used to produce a slight convex curve with the surface of the substrate having the hydrogel being on the interior and the surface of the substrate without the hydrogel being on the exterior.

A fourth hydrogel pattern 640 includes hydrogel lines 642a-642e for a morphing paper airplane, similar to the morphing airplane of FIG. 3. A heating element formed using conductive ink 641 can be located below the hydrogel lines 642a-642e, and is visible between each pair of adjacent hydrogel lines 642a-642e.

FIG. 7 depicts components of an example morphing object 700. The morphing object 700 includes a substrate 701 and a heating element formed by printing conductive ink traces 702a-702c onto a surface of the substrate 701. The morphing object 700 also includes a hydrogel pattern formed by printing parallel hydrogel lines 703 onto the surface of the substrate 701 and multiple color ink areas 704 and 705 formed by printing one or more colors of ink onto the surface of the substrate 701.

FIG. 8 depicts components of another example morphing object 800. The morphing object 800 includes a substrate 801 and a heating element formed by printing conductive ink traces 802a-802c onto a surface of the substrate 801. The morphing object 800 also includes a hydrogel pattern formed by printing parallel hydrogel lines 803 onto the surface of the substrate 801. The morphing object 800 also includes printed lines 804, 805, and 806 that instruct a user to fold or cut the substrate along those lines. For example, the lines 804, 805, and 806 can be printed onto the substrate 801 using color ink and can include different patterns (e.g., dashed or dot dashed) to indicate different instructions (e.g., cut or fold). In another example, instructions can be printed on the substrate 801, e.g., a drawing of a small pair of scissors near a cut line or a drawing of a small diagram of paper being folded near a fold line. The instructions could also include words printed on the substrate.

The inclusion of fold and/or cut lines can enable the user to perform pre-processing actions to prepare the morphing object 800 for morphing. For example, pre-folding the substrate 801 in some areas may help the morphing object to take the proper shape when the hydrogels are activated.

Figure 9:
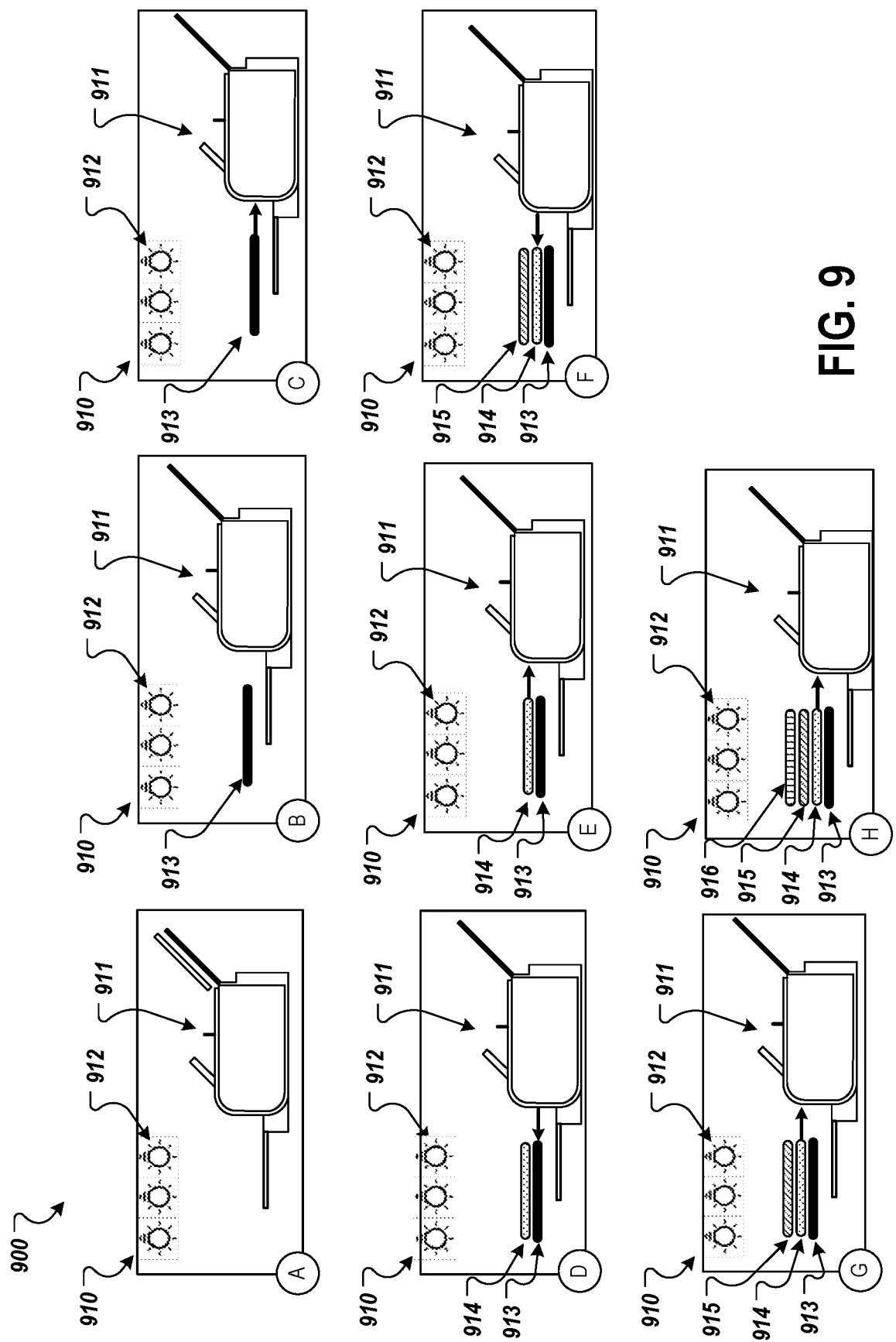
FIG. 9 depicts an example process for creating a morphing object.

FIG. 9 depicts an example process 900 for creating a morphing object. In this example, the morphing object is created using an inkjet printer 911 that is located in an isolated environment 910 that isolates the printer 911 from some elements, such as air and/or outside light. For example, the isolated environment can be an airtight box or airtight room that includes walls that prevent outside light from entering the isolated environment 910.

The printer 911 can include ink cartridges, tanks of ink, or other appropriate ink sources. The ink sources can include a color ink source, a conductive ink source, a hydrogel ink source, and an encapsulation ink source.

The isolated environment 910 also includes a light source 912 that is used for crosslinking the hydrogel ink. A controller can control the light source 912, e.g., a controller of the printer 911 or another controller that controls the printer 911 and the light source 912.

In stage A, a substrate is loaded into the printer 911. In stage B, the printer 911 prints conductive ink on a surface of the substrate 913. The printer 911 can print the conductive ink on the surface of the substrate 913 based on a pre-defined pattern for the heating element of the morphing object.

In stage C, the substrate 913 with the conductive ink is pulled back into the printer 911. For example, the printer 911 can pull the substrate 913 back into the printer 911. In another example, a person or other component can place the substrate 913 back into the printer 911. In stage D, the printer 911 prints hydrogel ink on the surface of the substrate 913. The printer 911 can print the hydrogel ink on the surface of the substrate 913 based on a pre-defined hydrogel pattern. The light source 912 is also activated to crosslink the hydrogel.

In stage F, the substrate 913 with the conductive ink and hydrogel is pulled back into the printer 911. For example, the printer 911 can pull the substrate 913 back into the printer 911. The light source 912 can also be deactivated.

In stage E, the printer 911 prints the encapsulation ink on the substrate 913. The printer 911 can print the encapsulation ink on the substrate 913 based on a predefined pattern such that the encapsulation ink covers the hydrogel ink that has been printed on the substrate 912.

In stage F, the substrate 913 is pulled back into the printer 911. For example, the printer 911 can pull the substrate 913 back into the printer 911. In another example, a person or other component can place the substrate 913 back into the printer 911. In stage G, the printer 911 prints color ink on the substrate 913. The printer 911 can print the color ink on the substrate 913 based on a pre-defined pattern. Stage F can be an independent stage or combined with another stage, e.g., combined with stage B when the conductive ink is applied to the substrate.

At this point, the substrate 913 can be removed from the printer 911 and connected to a controller for activating the morphing object. If any pre-cutting or pre-folding is required/desired, this can be performed prior to activating the hydrogel for morphing the morphing object.

Figure 10:
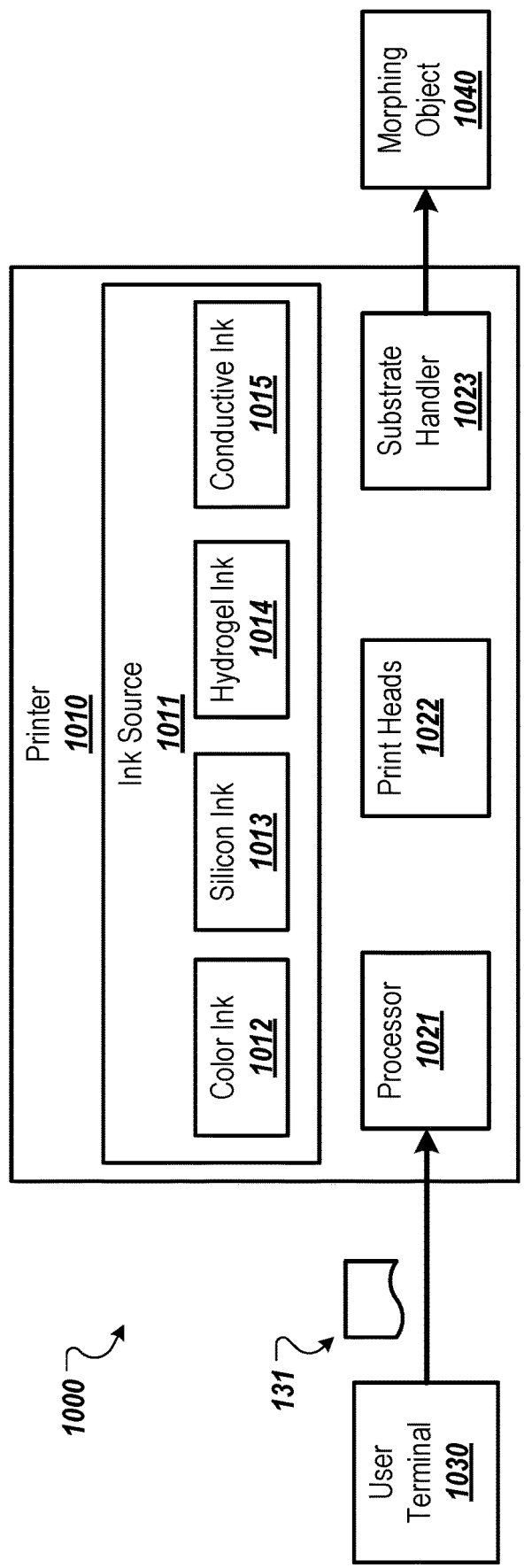
FIG. 10 depicts an environment in which an inkjet printer system creates morphing objects.

FIG. 10 depicts an environment 1000 in which an inkjet printer 1010 creates morphing objects. The printer 1010 includes an ink source 1011 that includes ink for printing on substrates. The ink source 1011 can include ink cartridges, ink tanks, and/or other appropriate ink sources. In this example, the ink source 1011 includes color ink 1012, silicon ink 1013 for encapsulating hydrogels, hydrogel ink 1014, and conductive ink 1015. In this example, there is one color ink, but in other examples there can be multiple colors, e.g., if encapsulation ink is not used or more than four ink sources can be used. In another example, the ink source 1011 can include multiple conductive inks having different resistances.

The printer 1010 also includes a processor 1021 that controls the printer's functions, print heads 1022, and a substrate handler 1023 that loads substrates into the printer 1010, moves the substrates through the printer 1010, and/or holds substrates output by the printer 1010.

The printer 1010 can receive patterns 131 to print from a user terminal 1030. A user can use the terminal 1030 to generate patterns 131 for morphing objects. As an ink printer 1010 is being used to create the morphing objects, the pattern 131 can define locations on a substrate to print conductive ink 1015 to form a heating element, locations on the substrate to print hydrogel ink 1014 for folding the substrate, locations on the substrate to print silicon ink 1013 to encapsulate the hydrogel ink 1014, and/or locations on the substrate to print color ink.

In some implementations, the patterns 131 can be represented using a particular color for each type of ink as most inkjet printers use such color patterns to print ink on substrates. For example, inkjet printers typically have black, cyan, magenta, and yellow ink cartridges or tanks. If the color ink is cyan, the locations for printing cyan ink can be specified using cyan lines in the pattern 131. In addition, the locations for printing the other types of ink can be specified using the other possible colors, which would typically be black, magenta, and yellow. Thus, in one example, the locations to print conductive ink can be specified using black lines, the locations to print hydrogel ink can be specified using yellow lines, and the locations to print silicon ink can be specified using magenta lines. In this example, the black ink can be replaced with conductive ink, the yellow ink can be replaced with hydrogel ink, and the magenta ink can be replaced with silicon ink, e.g., by replacing the respective ink cartridges or ink tanks in the printer 1010.

The printer 1010 can use the pattern 131 to print the inks on a substrate to generate the morphing object. For example, the printer 1010 can use the process 900 of FIG. 9 or the process 1200 of FIG. 12 to print the inks on the substrate for generate the morphing object.

Figure 11:
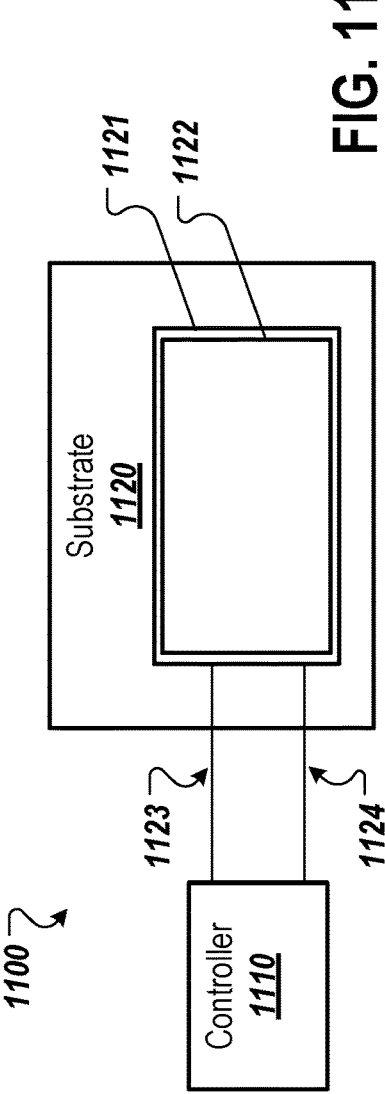
FIG. 11 depicts an example morphing object.

FIG. 11 depicts a block diagram of an example morphing object 1100. The morphing object 1100 includes a substrate 1120 that includes a heating element 1121 formed by conductive ink, a hydrogel pattern 1122 formed by hydrogel ink, and conductive traces 1123 and 1224 that are connected to the heating element 1121. The morphing object 1100 also includes a controller 1110 that is connected to the conductive traces 1123 and 1124. The controller 1110 can cause the substrate 1120 to fold and change shape by applying a current to the heating element 1121, e.g., by passing DC current from the conductive trace 1123 through the conductive traces of the heating element 1121 to the conductive trace 1124 and back to the controller 1110.

In some implementations, the controller 1110 can be connected to multiple heating elements printed on the substrate 1120. In this example, the controller 1110 can activate the heating elements based on a defined sequence to cause the substrate to change shapes. For example, if the morphing object includes multiple folds that should happen in sequence, the controller 1110 can be configured to activate the appropriate heating elements according to the sequence.

In another example, the controller 1110 can control the sequence of folds by varying the amount of current flowing through a heating element 1121. For example, different traces of the heating element 1121 can have different resistances that dissipate different amounts of heat. As the current increases, the amount of heat of each trace increases. However, due to the different resistances, the hydrogel traces would activate at different times.

Figure 12:
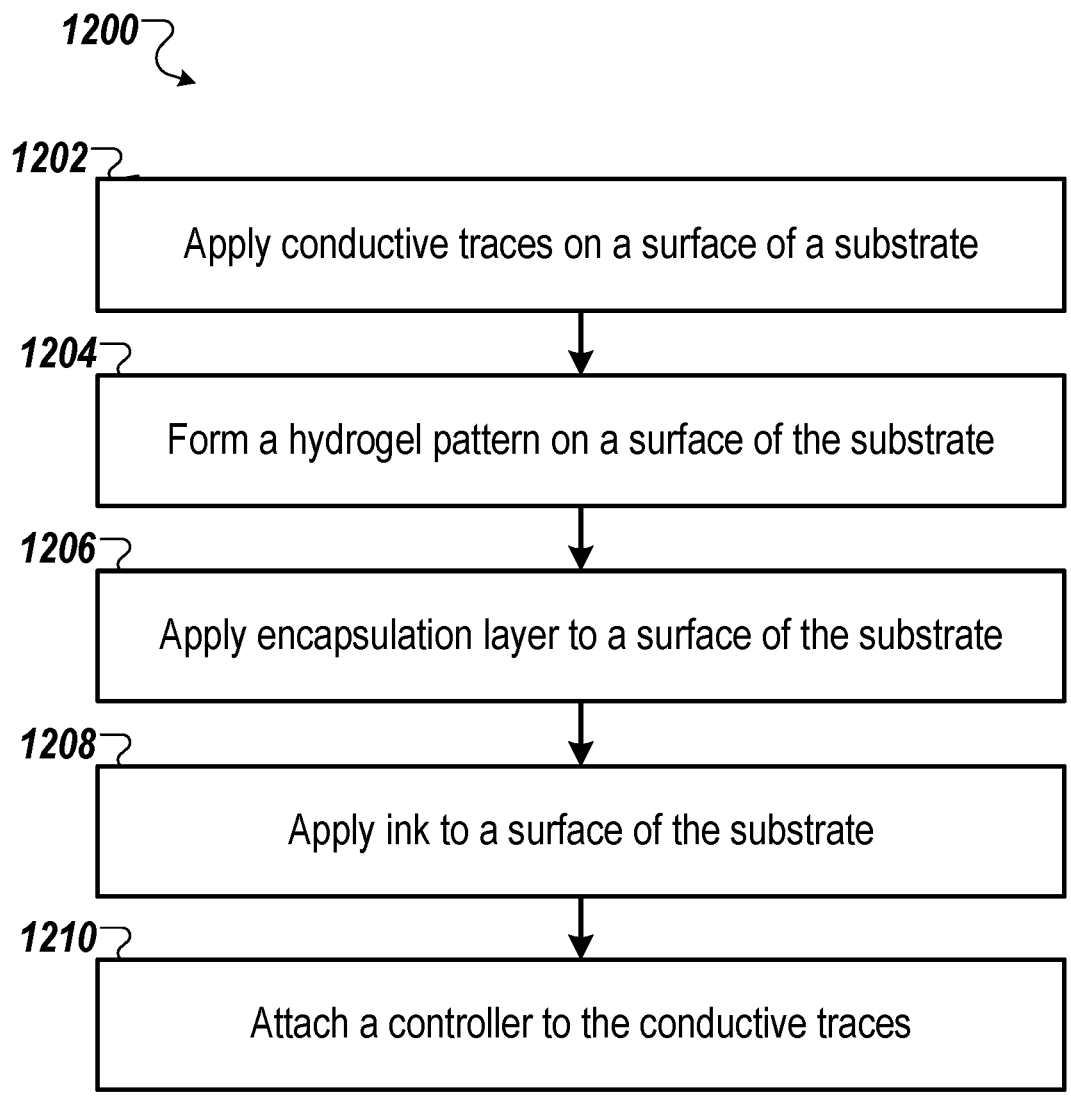
FIG. 12 depicts an example process for creating morphing objects.

FIG. 12 depicts an example process 1200 for creating morphing objects. The example process 1200 can be performed by an inkjet printer, e.g., the inkjet printer 1010 of FIG. 10.

The printer applies conductive traces on a surface of a substrate (1202). For example, the printer can receive a pattern for a morphing object. The pattern can include color lines that indicate the type of ink to apply at various locations on the surface of the substrate. The printer can use the color lines of the pattern to determine the locations to print conductive ink and print the conductive ink in those locations.

The printer forms a hydrogel pattern on a surface of the substrate (1204). The printer can print hydrogel ink on the same surface of the substrate as the conductive ink or on the opposite surface of the substrate. The printer can use the pattern to determine the locations on the substrate to print the hydrogel ink and print the hydrogel ink in those locations. The hydrogel ink can then be crosslinked by activating a light source.

The printer applies an encapsulation layer to a surface of the substrate (1206). The printer can print encapsulation ink on the same surface of the substrate as the hydrogel ink, e.g., to cover and encapsulate the hydrogel ink. The printer can use the pattern to determine the locations on the substrate to print the encapsulation ink and print the encapsulation ink in those locations.

The printer applies color ink to a surface of the substrate (1208). The printer can apply color ink to one or both sides of the substrate based on the pattern. The printer can apply the color ink before or after applying the hydrogel and its optional encapsulation layer. For example, the printer can apply the color ink before or at the same time as applying the conductive ink, or after applying the conductive ink but before applying the hydrogel.

A controller is attached to the conductive traces printed on the substrate (1210). A positive DC voltage terminal of the controller can be connected to a positive conductive trace of the substrate. A DC ground terminal of the controller can be connected to a ground conductive trace of the substrate.

The controller can be configured, e.g., programmed by a user, to activate the hydrogel pattern. For example, the controller can be configured to activate the hydrogel in response to particular events, e.g., a user pressing a button on the controller. The controller can also be configured to activate multiple heating elements in sequence, e.g., using timers that indicate when each heating element should be activated.

Figure 13:
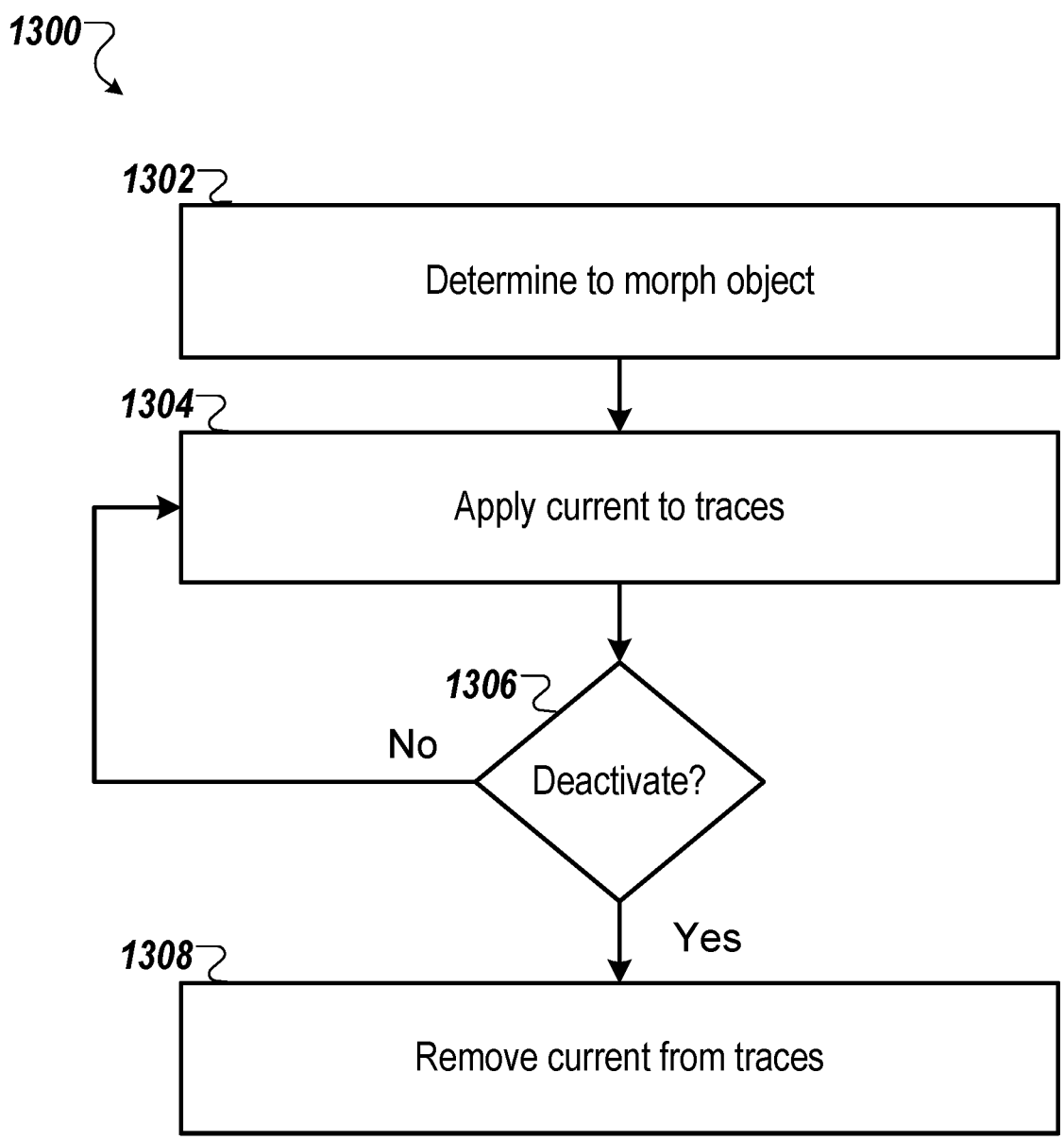
FIG. 13 depicts an example process for activating and deactivating a morphing object.

FIG. 13 depicts an example process 1300 for activating and deactivating a morphing object. The process 1300 can be performed by a controller, e.g., the controller 1110 of FIG. 11.

A determination is made to morph a morphing object (1302). The controller can make this determination in response to a user command or other event.

The controller applies an electrical current to the conductive traces of the morphing object (1304). The controller can apply a steady current across the conductive traces for a particular time period or until the morphing object is to return to its original shape. In another example, the controller can vary the current in a sequence to activate heating elements in a corresponding sequence.

In another example, the controller can apply current to different heating elements in sequence to control the folding of the substrate of the morphing object. For example, the controller can first apply current to a particular heating element. After a particular amount of time lapses, the controller can apply current to a next heating element and so on. The controller can maintain the current on each heating element until it is time to allow the morphing object return to its original shape.

The controller makes a determination as to whether to deactivate the hydrogels and let the morphing object return to its original shape (1306). If no, the controller continues applying the current across the conductive traces of the heating element(s). If so, the controller removes the current from the conductive traces of the heating element(s). The controller can remove the currents in sequence, e.g., an opposite sequence from the activation sequence, to allow the morphing object to return to its original shape.

Although the morphing objects are described as having conductive traces for activating the hydrogels, other actuation sources can be used due to the relatively low actuation temperature. One example stimulus is environmental heat either from the sun, a candle, or a light. A black paper substrate can be better suited for these sources. Another example stimulus is from an electronic source such as a heat gun or, as described above, resistive heating via conductive traces. Another example stimulus is from the body temperature of the user themselves either at normal temperature, or elevated body temperature resulting from exercise or a fever.

There are many different applications for using hydrogels to create morphing objects. As described above, different hydrogel patterns can affect the morphing behavior of the objects. Beyond this, normal ink can also be printed onto the substrates to add images and templates to the sheet. This is unlike Printed Paper Actuator, which would require a pigment printer to add images and a FDM 3D printer to add the conductive/morphing traces, along with difficulties in accurate registration. One example application of this is to be able to create images that morph instead of just plain paper. This technique allows for the addition of cut lines for kirigami structures. This improves over the accuracy of cutting done by hand, and improves the reproducibility. The cut outline could also just be a specific shape cut out.

Another example application is a self-deploying face mask. A face mask can be triggered to expand and cover a user's mouth and nose. This is useful in situations where one is mostly walking alone, and only occasionally passes another person. Rather than touching/grabbing the mask to raise it, this approach offers a touch free alternative. The hydrogels can morph to open an area just around the user's mouth and nose or can "roll" to one side or the other.

Another example application is a haptic mousepad. In this application, a morphing mousepad with variable traces is realized. Specifically, the mousepad can change surface friction from slippery to rubbery. This can be used for increasing control for precision tasks, such as creating graphics or illustrations or modifying images. This can also be used for creating haptic digital experiences such as "vibrations" as someone moves their mouse across strips of alternating friction. This can also be used for "Locking" the mouse to discourage movement, for example if someone else is editing the same document. This can also be used for assisting visually disabled people with locating buttons or between windows.

Another example application is an animated kirigami book. In this application, an interactive morphing book can leverage a kirigami morphing complexity that would be difficult to achieve with other techniques. Specifically, as the user open the book, a 3D representation of the NYC Vessel building can morph out of the page and can be used for more engaging storytelling.

Another example application is a fever monitor. Because the hydrogel can be designed to actuate at different temperatures, in this application it can be designed/programmed to actuate just above normal skin temperature. Rather than having to take your temperature at distinct time points with an external thermometer, this approach would require no external power source and can act as a passive health indicator. This could be specifically useful for parents of young children to easily monitor their child's temperature from a distance.

Another example application is active sports clothing. Current athletic wear can be designed to wick moisture (sweat) away from the body or will have mesh vents in specific areas to cool the body. Rather than placing these vents in specific areas, mesh vents can be replaced with morphing object-based vents that automatically open when the surface of the body reaches a certain temperature. Different temperature thresholds can be set at different parts of the body and activate at different temperatures depending on the environment the user is in.

Another example application is a display. The morphing substrates can be used to fabricate morphing ambient displays, such as a flower that blooms to indicate you should catch up with a friend.

Another example application is engaging home prints. Most printing from an inkjet printer is two dimensional and only allows for different colors to be printed. By inkjet printing conductive circuits and hydrogels in the same print, a new dimension can be added to standard home printing. Some interesting examples can include 2.5 or 3D plots and graphs, and visualizing 3D objects not only on a 2D piece of paper.

Embodiments of the subject matter and the functional operations described in this specification can be implemented in digital electronic circuitry, in tangibly embodied computer software or firmware, in computer hardware, including the structures disclosed in this specification and their structural equivalents, or in combinations of one or more of them. Embodiments of the subject matter described in this specification can be implemented as one or more computer programs, i.e., one or more modules of computer program instructions encoded on a tangible non transitory program carrier for execution by, or to control the operation of, data processing apparatus. Alternatively or in addition, the program instructions can be encoded on an artificially generated propagated signal, e.g., a machine generated electrical, optical, or electromagnetic signal, that is generated to encode information for transmission to suitable receiver apparatus for execution by a data processing apparatus. The computer storage medium can be a machine-readable storage device, a machine-readable storage substrate, a random or serial access memory device, or a combination of one or more of them. The computer storage medium is not, however, a propagated signal.

The term "data processing apparatus" encompasses all kinds of apparatus, devices, and machines for processing data, including by way of example a programmable processor, a computer, or multiple processors or computers. The apparatus can include special purpose logic circuitry, e.g., an FPGA (field programmable gate array) or an ASIC (application specific integrated circuit). The apparatus can also include, in addition to hardware, code that creates an execution environment for the computer program in question, e.g., code that constitutes processor firmware, a protocol stack, a database management system, an operating system, or a combination of one or more of them.

A computer program (which may also be referred to or described as a program, software, a software application, a module, a software module, a script, or code) can be written in any form of programming language, including compiled or interpreted languages, or declarative or procedural languages, and it can be deployed in any form, including as a standalone program or as a module, component, subroutine, or other unit suitable for use in a computing environment. A computer program may, but need not, correspond to a file in a file system. A program can be stored in a portion of a file that holds other programs or data, e.g., one or more scripts stored in a markup language document, in a single file dedicated to the program in question, or in multiple coordinated files, e.g., files that store one or more modules, sub programs, or portions of code. A computer program can be deployed to be executed on one computer or on multiple computers that are located at one site or distributed across multiple sites and interconnected by a communication network.

As used in this specification, an "engine," or "software engine," refers to a software implemented input/output system that provides an output that is different from the input. An engine can be an encoded block of functionality, such as a library, a platform, a software development kit ("SDK"), or an object. Each engine can be implemented on any appropriate type of computing device, e.g., servers, mobile phones, tablet computers, notebook computers, music players, e book readers, laptop or desktop computers, PDAs, smart phones, or other stationary or portable devices, that includes one or more processors and computer readable media. Additionally, two or more of the engines may be implemented on the same computing device, or on different computing devices.

The processes and logic flows described in this specification can be performed by one or more programmable computers executing one or more computer programs to perform functions by operating on input data and generating output. The processes and logic flows can also be performed by, and apparatus can also be implemented as, special purpose logic circuitry, e.g., an FPGA (field programmable gate array) or an ASIC (application specific integrated circuit).

Computers suitable for the execution of a computer program include, by way of example, can be based on general or special purpose microprocessors or both, or any other kind of central processing unit. Generally, a central processing unit will receive instructions and data from a read only memory or a random access memory or both. The essential elements of a computer are a central processing unit for performing or executing instructions and one or more memory devices for storing instructions and data. Generally, a computer will also include, or be operatively coupled to receive data from or transfer data to, or both, one or more mass storage devices for storing data, e.g., magnetic, magneto optical disks, or optical disks. However, a computer need not have such devices. Moreover, a computer can be embedded in another device, e.g., a mobile telephone, a personal digital assistant (PDA), a mobile audio or video player, a game console, a Global Positioning System (GPS) receiver, or a portable storage device, e.g., a universal serial bus (USB) flash drive, to name just a few.

Computer readable media suitable for storing computer program instructions and data include all forms of non volatile memory, media and memory devices, including by way of example semiconductor memory devices, e.g., EPROM, EEPROM, and flash memory devices; magnetic disks, e.g., internal hard disks or removable disks; magneto optical disks; and CD ROM and DVD ROM disks. The processor and the memory can be supplemented by, or incorporated in, special purpose logic circuitry.

To provide for interaction with a user, embodiments of the subject matter described in this specification can be implemented on a computer having a display device, e.g., a CRT (cathode ray tube) monitor, an LCD (liquid crystal display) monitor, or an OLED display, for displaying information to the user, as well as input devices for providing input to the computer, e.g., a keyboard, a mouse, or a presence sensitive display or other surface. Other kinds of devices can be used to provide for interaction with a user as well; for example, feedback provided to the user can be any form of sensory feedback, e.g., visual feedback, auditory feedback, or tactile feedback; and input from the user can be received in any form, including acoustic, speech, or tactile input. In addition, a computer can interact with a user by sending resources to and receiving resources from a device that is used by the user; for example, by sending web pages to a web browser on a user's client device in response to requests received from the web browser.

Embodiments of the subject matter described in this specification can be implemented in a computing system that includes a back end component, e.g., as a data server, or that includes a middleware component, e.g., an application server, or that includes a front end component, e.g., a client computer having a graphical user interface or a Web browser through which a user can interact with an implementation of the subject matter described in this specification, or any combination of one or more such back end, middleware, or front end components. The components of the system can be interconnected by any form or medium of digital data communication, e.g., a communication network. Examples of communication networks include a local area network ("LAN") and a wide area network ("WAN"), e.g., the Internet.

The computing system can include clients and servers. A client and server are generally remote from each other and typically interact through a communication network. The relationship of client and server arises by virtue of computer programs running on the respective computers and having a client server relationship to each other.

While this specification contains many specific implementation details, these should not be construed as limitations on the scope of any invention or of what may be claimed, but rather as descriptions of features that may be specific to particular embodiments of particular inventions. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system modules and components in the embodiments described above should not be understood as requiring such separation in all embodiments, and it should be understood that the described program components and systems can generally be integrated together in a single software product or packaged into multiple software products.

Particular embodiments of the subject matter have been described. Other embodiments are within the scope of the following claims. For example, the actions recited in the claims can be performed in a different order and still achieve desirable results. As one example, the processes depicted in the accompanying figures do not necessarily require the particular order shown, or sequential order, to achieve desirable results. In certain implementations, multitasking and parallel processing may be advantageous.

What is claimed is:

1. A method for creating a morphing object, the method comprising:

creating one or more heating elements on a substrate by applying one or more conductive traces onto at least one of a first surface of the substrate or a second surface of the substrate opposite the first surface, wherein applying the one or more conductive traces comprises printing, by an inkjet printer, a conductive ink on the at least one first surface or second surface; and forming a hydrogel pattern on the first surface of the substrate by printing, by the inkjet printer, a hydrogel ink on the first surface of the substrate based on a predefined pattern; and forming an encapsulation layer over the hydrogel pattern by printing, by the inkjet printer, encapsulation ink over the printed hydrogel ink.

2. The method of claim 1, wherein the encapsulation layer comprises a hydrophobic material.

3. The method of claim 2, wherein the inkjet printer comprises a first ink source comprising conductive ink, a second ink source comprising hydrogel ink, a third ink source comprising encapsulation ink, and a fourth ink source comprising color ink.

4. The method of claim 3, wherein the hydrogel ink comprises a combination of a hydrogel and a photoinitiator.

5. The method of claim 4, wherein the photoinitiator comprises 2,2-Diethoxyacetophenone (DEAP).

6. The method of claim 1, wherein the inkjet printer is installed in an isolated box with a light source for cross-linking the hydrogel ink.

7. The method of claim 1, further comprising forming an additional hydrogel pattern on the second surface of the substrate by applying the hydrogel to the second surface of the substrate based on an additional predefined pattern.

8. The method of claim 1, wherein the substrate comprises paper, waxed traces paper, a clear projector sheet, or inkjet tattoo paper.

9. The method of claim 1, wherein the hydrogel comprises at least one of a Poly(N-isopropylacrylamide) (PNIPAM) hydrogel or a combination of two or more of N-Isopropylacrylamide, N,N'-Methylenebisacrylamide, 2,2-Diethoxyacetophenone, distilled water, Ethylene Glycol, and sodium dodecyl sulfate.

10. The method of claim 1, wherein the one or more conductive traces comprises at least one conductive trace having a different width than another conductive trace.

11. The method of claim 1, wherein the one or more conductive traces comprises a first conductive trace formed using a first conductive ink having a first resistance and a second trace formed using a second conductive trace having a second resistance different from the first resistance.

12. The method of claim 1, further comprising connecting a controller to the one or more conductive traces.

13. The method of claim 1, wherein the formed encapsulation layer over the hydrogel pattern forms a protective barrier that prevents the printed hydrogel pattern from drying due to environmental exposure.

14. The method of claim 1, wherein the encapsulation ink forms a seal around the hydrogel ink.

* * * * *